(12) United States Patent
Yamada et al.

(10) Patent No.: US 12,014,874 B2
(45) Date of Patent: Jun. 18, 2024

(54) SERVO DRIVER WITH SIMPLE ASSEMBLY WORK OF CAPACITOR TO HOUSING

(71) Applicant: OMRON Corporation, Kyoto (JP)

(72) Inventors: Shuhei Yamada, Kyoto (JP); Keisuke Mori, Kyoto (JP)

(73) Assignee: OMRON Corporation, Kyoto (JP)

( * ) Notice: Subject to any disclaimer, the term of this patent is extended or adjusted under 35 U.S.C. 154(b) by 194 days.

(21) Appl. No.: 17/635,378

(22) PCT Filed: Feb. 5, 2020

(86) PCT No.: PCT/JP2020/004347
§ 371 (c)(1),
(2) Date: Feb. 15, 2022

(87) PCT Pub. No.: WO2021/053845
PCT Pub. Date: Mar. 25, 2021

(65) Prior Publication Data
US 2022/0293340 A1 Sep. 15, 2022

(30) Foreign Application Priority Data
Sep. 19, 2019 (JP) .................. 2019-170460

(51) Int. Cl.
*H01G 2/04* (2006.01)
*G05B 19/404* (2006.01)
(Continued)

(52) U.S. Cl.
CPC .......... *H01G 2/04* (2013.01); *G05B 19/404* (2013.01); *H02M 7/003* (2013.01); *H02M 7/48* (2013.01); *H05K 7/12* (2013.01); *G05B 2219/41* (2013.01)

(58) Field of Classification Search
None
See application file for complete search history.

(56) References Cited

U.S. PATENT DOCUMENTS

| 2007/0109715 A1* | 5/2007 | Azuma | B60K 6/28 |
| | | | 361/299.3 |
| 2019/0198246 A1* | 6/2019 | Kanda | H01G 4/224 |
| 2023/0199979 A1* | 6/2023 | Stilianos | H01G 2/04 |
| | | | 174/535 |

FOREIGN PATENT DOCUMENTS

| JP | 2012039047 | 2/2012 |
| JP | 2013110317 | 6/2013 |

(Continued)

OTHER PUBLICATIONS

"International Search Report (Form PCT/ISA/210) of PCT/JP2020/004347," mailed on Apr. 21, 2020, with English translation thereof, pp. 1-4.

(Continued)

Primary Examiner — Eric W Thomas
(74) Attorney, Agent, or Firm — JCIPRNET

(57) ABSTRACT

A servo driver is provided with a housing, a substantially cylindrical capacitor, and a case body in which the capacitor is stored. The case body has a substantially box-like shape formed by being provided with an opening portion that makes it possible to take in and out the capacitor with respect to the case body along a direction orthogonal to an axial direction of the capacitor, and is assembled to the housing so that the opening portion is covered with a closing portion that is a part of the housing. An elastically deformable cushion material is interposed between the closing portion and the capacitor. While being elastically biased to a bottom portion of the case body, the capacitor is thereby sandwiched and held between the closing portion and the bottom portion.

8 Claims, 12 Drawing Sheets

(51) Int. Cl.
*H02M 7/00* (2006.01)
*H02M 7/48* (2007.01)
*H05K 7/12* (2006.01)

(56) References Cited

FOREIGN PATENT DOCUMENTS

| | | |
|---|---|---|
| JP | 2014096963 | 5/2014 |
| JP | 2016178778 | 10/2016 |
| JP | 2017085883 | 5/2017 |

OTHER PUBLICATIONS

"Written Opinion of the International Searching Authority (Form PCT/ISA/237)" of PCT/JP2020/004347, mailed on Apr. 21, 2020, with English translation thereof, pp. 1-6.

\* cited by examiner

SERVO DRIVER WITH SIMPLE ASSEMBLY WORK OF CAPACITOR TO HOUSING

CROSS-REFERENCE TO RELATED APPLICATION

This application is a 371 application of the International PCT application serial no. PCT/JP2020/004347, filed on Feb. 5, 2020, which claims the priority benefit of Japan Patent Application No. 2019-170460, filed on Sep. 19, 2019. The entirety of each of the above-mentioned patent applications is hereby incorporated by reference herein and made a part of this specification.

TECHNICAL FIELD

The present disclosure relates to a servo driver for controlling an operation of a servo motor.

BACKGROUND ART

A servo driver controls an operation of a servo motor in accordance with a command from a host controller and more specifically, controls an output torque, a rotation speed, a position, or the like of the servo motor. The servo driver includes an inverter equipped with a converter circuit, a smoothing circuit, an inverter circuit, a control circuit, a regenerative resistor, and the like in order to supply an appropriate amount of electric power to the servo motor at an appropriate timing and thus supplies AC electric power adjusted to have an arbitrary frequency to the servomotor.

Here, in the inverter, a capacitor constituting the smoothing circuit is a large electric component as compared with other electric components and occupies a large portion of a space inside a housing. Generally, the capacitor has a substantially cylindrical outer shape and has a configuration in which a pair of connection terminals are provided on one end surface in an axial direction thereof. Therefore, when designing a servo driver, how to reliably hold this capacitor inside the housing is an important issue.

For example, in Japanese Patent Laid-Open No. 2012-39047 (Patent Literature 1) and Japanese Patent Laid-Open No. 2013-110317 (Patent Literature 2), a capacitor device that is modularized in a manner that a storage case formed in a tubular shape so that a capacitor can be taken in and out in an axial direction of the capacitor is provided and the capacitor is held by the storage case is disclosed.

In the capacitor device, a configuration in which the storage case is made of a metal member so that heat generated in the capacitor can be efficiently dissipated to the outside and a gap is provided between an outer peripheral surface of the capacitor and an inner peripheral surface of the storage case and is filled with a filler having high thermal conductivity is employed.

If the storage case of the capacitor device is fixed to the housing while employing the configuration disclosed in these publications, the capacitor can be relatively reliably held inside the housing.

CITATION LIST

Patent Literature

Patent Literature 1: Japanese Patent Laid-Open No. 2012-39047
Patent Literature 2: Japanese Patent Laid-Open No. 2013-110317

SUMMARY OF INVENTION

Technical Problem

However, all of the configurations disclosed in the above-mentioned publications are designed on the premise that a portion between the capacitor and the storage case is filled with a filler having high thermal conductivity. Therefore, in a case where a heat generation amount of the capacitor is extremely large, these configurations are suitable. However, in a case where a heat generation amount of the capacitor is not extremely large, or in a case where a heat generation amount of the capacitor is large and the heat generated in the capacitor can be dissipated appropriately by another alternative means different from the heat dissipation means as disclosed in the above-mentioned publications, these configurations are not always suitable configurations.

That is, in a case where the heat dissipation means as disclosed in the above-mentioned publications is not employed, it is possible to facilitate assembly work by employing a simpler configuration when modularizing the capacitor device by storing the capacitor in the storage case.

Therefore, the present disclosure has been made in view of the problems described above, and an objective of the present disclosure is to provide a servo driver in which a capacitor constituting a smoothing circuit of an inverter can be reliably held inside a housing and the capacitor can be easily assembled to the housing.

Solution to Problem

A servo driver according to an aspect of the present disclosure is for controlling an operation of a servo motor and includes a capacitor, a case body, and a housing. The capacitor constitutes a smoothing circuit of an inverter and has a substantially cylindrical outer shape. The capacitor is stored in the case body, and the capacitor and the case body are housed in the housing. The case body has a substantially box-like shape formed by being provided with an opening portion that makes it possible to take in and out the capacitor with respect to the case body along a direction orthogonal to an axial direction of the capacitor. The case body is assembled to the housing so that the opening portion is covered with a closing portion that is a part of the housing. In the servo driver according to the above aspect of the present disclosure, the capacitor is sandwiched and held between the closing portion and a bottom portion of the case body located on a side opposite to a side on which the opening portion is provided while being elastically biased to the bottom portion with a cushion material that is elastically deformable and is interposed between the closing portion and the capacitor.

With this configuration, when the capacitor is housed in the case body and modularized as the capacitor module, not only the capacitor can be easily fitted to the case body, but also the capacitor stored in the case body can be sandwiched and held between the bottom portion of the case body and the closing portion which is a part of the housing. As a result, the assembly work is greatly facilitated. Further, by setting the cushion material between the capacitor and the closing portion, it is possible to reliably hold the capacitor with the case body and the housing. Therefore, by employing the above configuration, it is possible to provide the servo driver in which the capacitor can be reliably held inside the housing and the capacitor can be easily assembled to the housing.

In the servo driver according to the above aspect of the present disclosure, it is preferable that the cushion material be attached to either the closing portion or the capacitor.

With such a configuration, the cushion material can be considerably easily interposed between the closing portion and the capacitor, and the assembly work can be further facilitated.

In the servo driver according to the above aspect of the present disclosure, the housing may include a lid body including a portion in which the closing portion is provided and a box body having an opening closed by the lid body. In this case, the case body may have a plurality of protrusions protruding in a direction orthogonal to a direction in which the opening portion and the bottom portion are aligned with each other, and a plurality of holes may be provided in a portion of the box body facing the case body in the direction orthogonal to the direction in which the opening portion and the bottom portion are aligned with each other. Further, in this case, the case body may be fixed to the box body by the plurality of protrusions being fitted to the plurality of holes.

With this configuration, the capacitor module is fixed to the box body in the housing by being fitted thereto in advance, and then the opening portion of the case body is covered with the lid body of the housing. This simple assembly work makes it possible to assemble the capacitor to the housing. Therefore, the assembly work can be further facilitated.

The servo driver according to the above aspect of the present disclosure may include an electricity storage state detection unit provided with a detection circuit that detects an electricity storage state of the capacitor by measuring a potential difference between a pair of connection terminals of the capacitor and a light emitting body that displays a detection result obtained from the detection circuit by being lit or not. In this case, the electricity storage state detection unit may be assembled to the case body, and a display window part enabling visual recognition from the outside of whether the light emitting body is lit or not may be provided in the housing.

With this configuration, the electricity storage state detection unit can be incorporated in the capacitor module, and further, with a simple configuration in which the display window part is provided in a part of the housing, it is possible to visually recognize from the outside whether the light emitting body provided in the electricity storage state detection unit is lit or not. Therefore, it becomes possible to greatly simplify the configuration for notifying the user of the electricity storage state, and in this respect, the assembly work of the servo driver is greatly facilitated.

In the servo driver according to the above aspect of the present disclosure, the capacitor and a circuit element component to be electrically connected to the capacitor may be connected by a bus bar. In this case, the bus bar may be divided into a capacitor-side bus bar having one end connected to the capacitor and a circuit element component-side bus bar having one end connected to the circuit element component and the other end connected to the other end of the capacitor-side bus bar.

With this configuration, a part of the bus bar is incorporated in the capacitor module, and thus when the capacitor module is assembled to the housing, the bus bar of a portion incorporated in the capacitor module is connected to the bus bar of a portion connected to the circuit element component previously assembled to the housing. This simple work makes it possible to electrically connect the capacitor to the circuit element component. Therefore, even in a case where the capacitor is stored in the case body and modularized, electrical connection can be reliably and easily performed.

In the servo driver according to the above aspect of the present disclosure, the case body may be made of an insulating resin member.

With this configuration, as compared with a case where the case body is made of a metal member, not only it is possible to preemptively prevent a short circuit from occurring, but also it is possible to significantly reduce the weight of the servo driver as a whole. Further, since the degree of freedom in designing the shape of the case body is increased, the capacitor can be held more reliably by the case body.

In the servo driver according to the above aspect of the present disclosure, the cushion material may be made of a cushion sheet having high thermal conductivity.

With this configuration, the heat generated in the capacitor is efficiently dissipated through the cushion material to the housing, and thus a good configuration can be obtained from the viewpoint of the heat dissipation efficiency of the capacitor.

Effects of Invention

According to the present disclosure, it is possible to provide a servo driver in which a capacitor constituting a smoothing circuit of an inverter can be reliably held inside a housing and the capacitor can be easily assembled to the housing.

DESCRIPTION OF EMBODIMENTS

Figure 1:
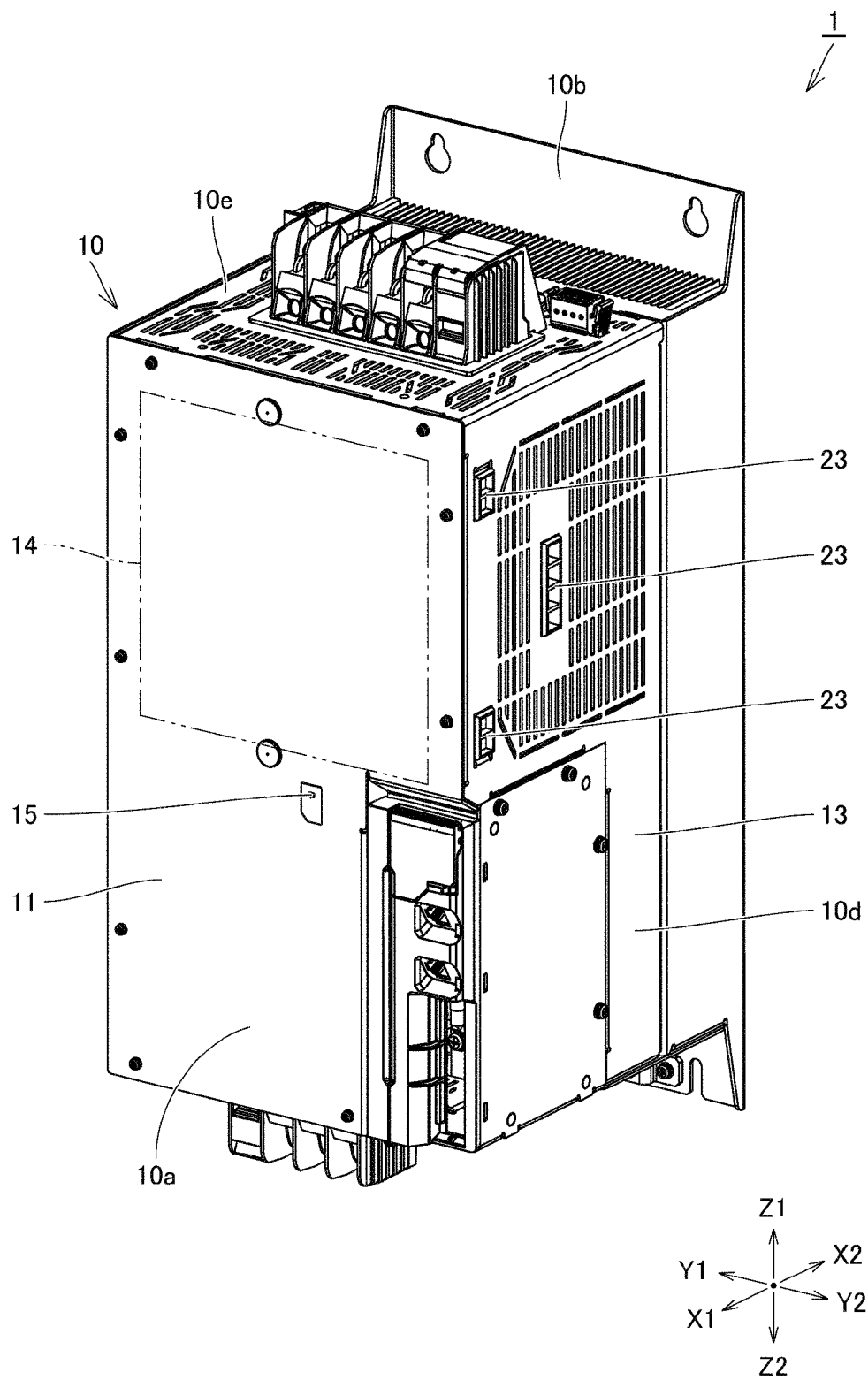
FIG. 1 is a perspective view of a servo driver according to an embodiment.

Hereinafter, an embodiment will be described in detail with reference to the drawings. In the embodiment which will be shown below, the same or common parts are designated by the same reference signs in the drawings, and the description thereof will not be repeated.

<A. Schematic Configuration of Servo Driver>

Figure 2:
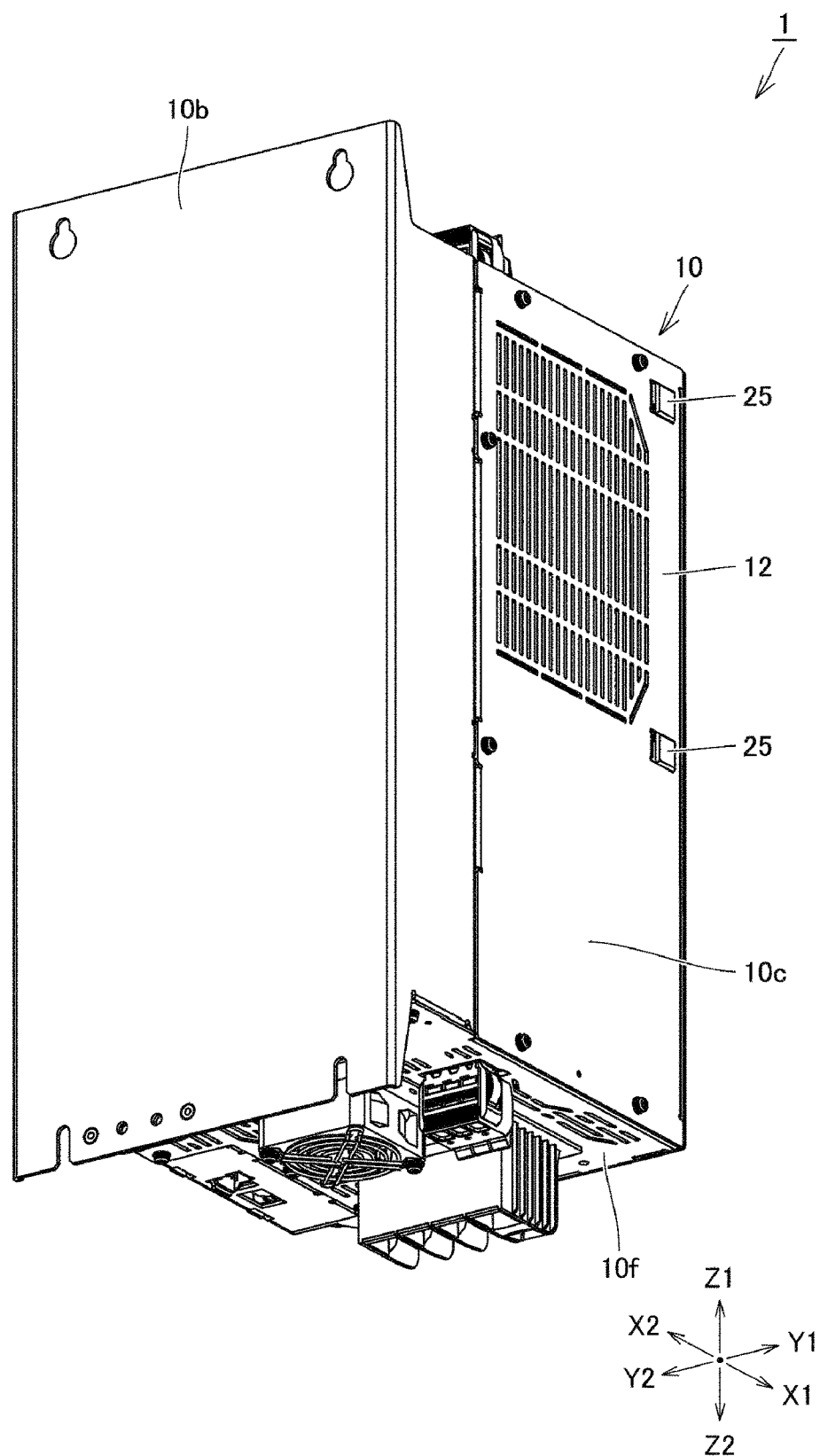
FIG. 2 is a perspective view of the servo driver shown in FIG. 1 as viewed in another direction.
Figure 3:
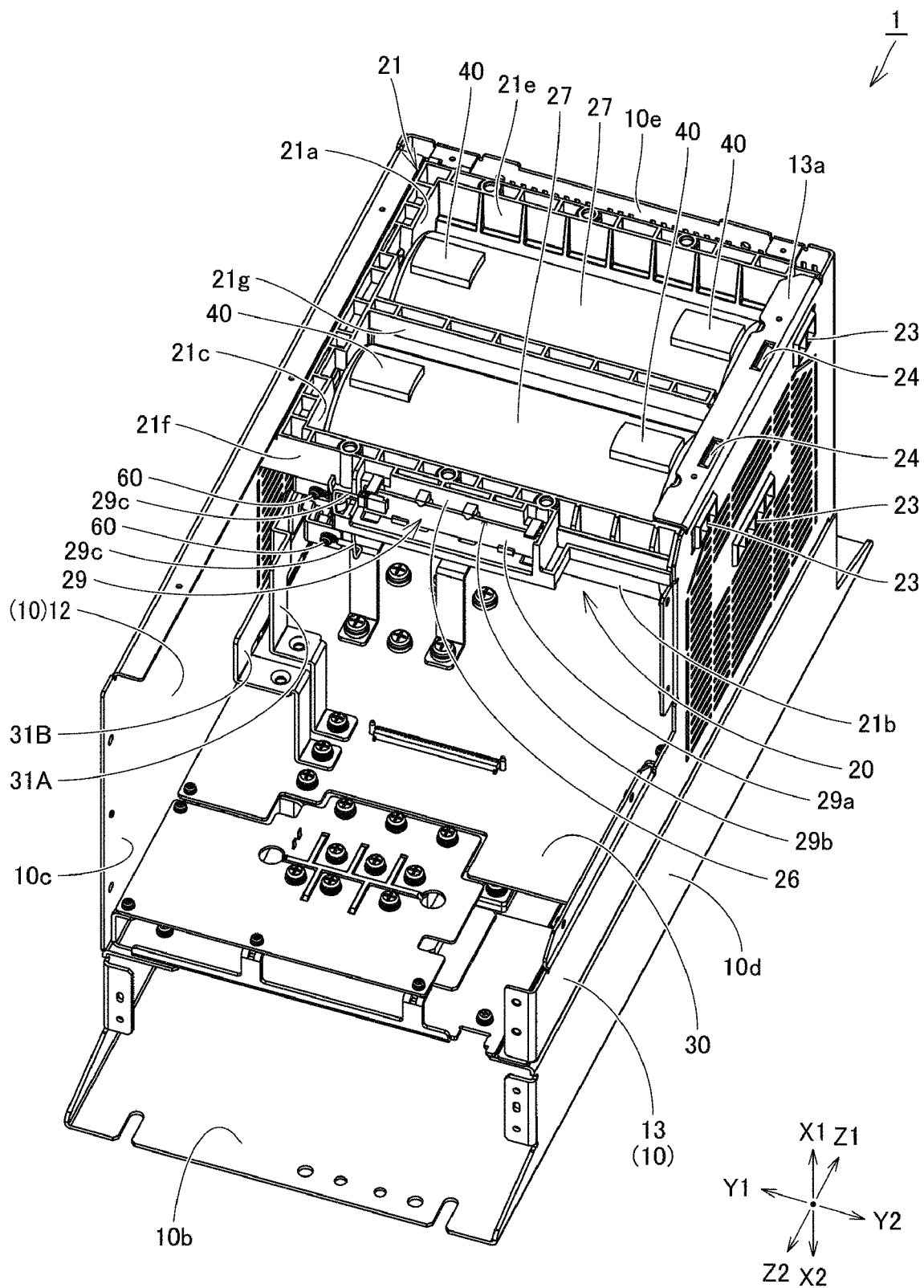
FIG. 3 is a perspective view of the servo driver shown in FIG. 1 in which illustration of a part of a housing and a part of internal components is omitted.
Figure 4:
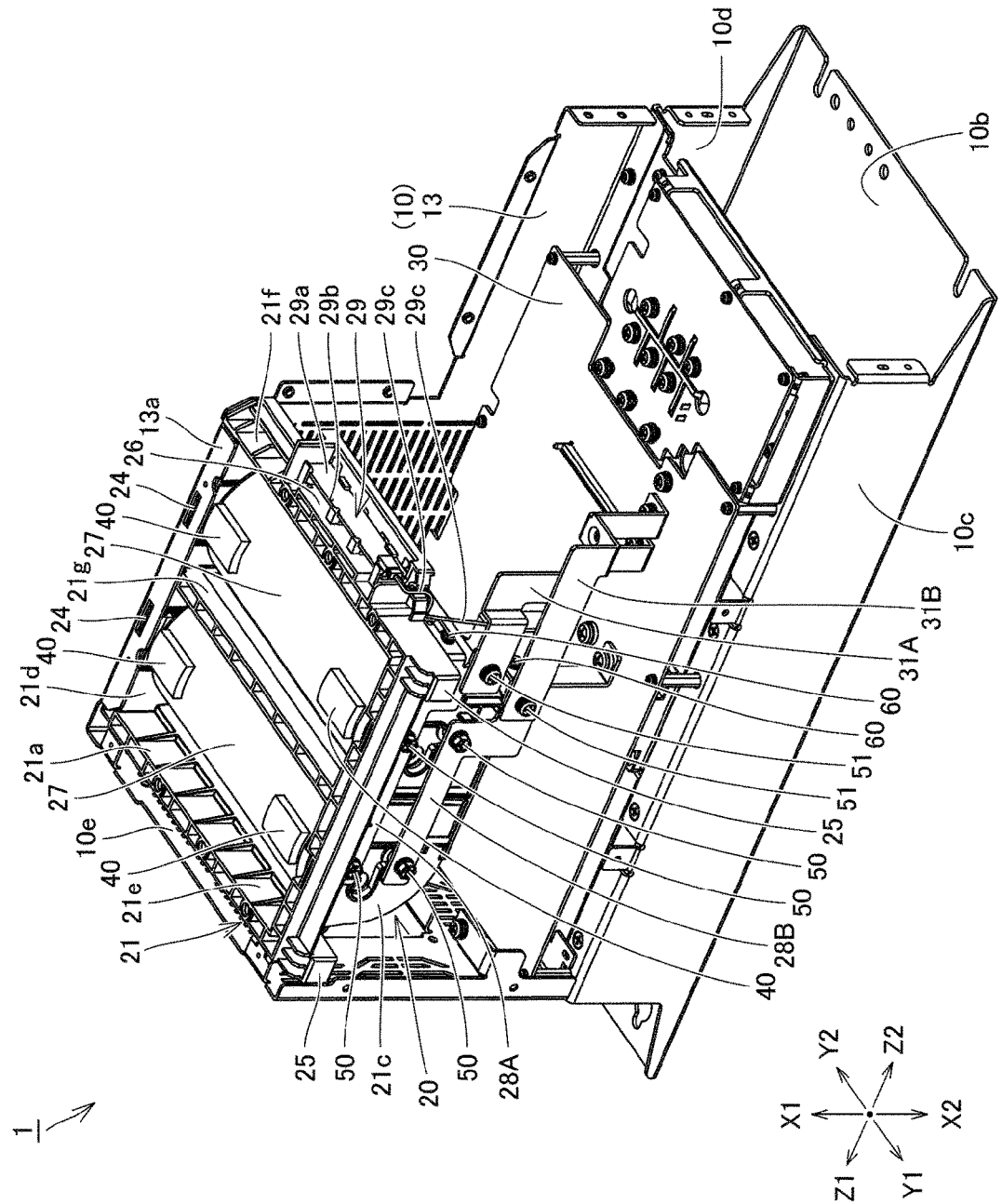
FIG. 4 is a perspective view of the servo driver shown in FIG. 1 in which illustration of a part of a housing and a part of internal components is omitted.

FIG. 1 is a perspective view of a servo driver according to an embodiment as viewed from the diagonally upper right of the front, and FIG. 2 is a perspective view of the servo driver as viewed from the diagonally lower left of the rear. FIGS. 3 and 4 are perspective views of the servo driver shown in FIG. 1 in which illustration of a part of a housing and a part of internal components is omitted. First, a schematic configuration of the servo driver 1 according to the present embodiment will be described with reference to FIGS. 1 to 4.

Here, the internal components of which illustration is omitted in FIGS. 3 and 4 are mainly electrical parts and the like excluding a capacitor module 20 and a main board 30 which will be described later, a part of the housing of which illustration is omitted in FIG. 3 is a front wall 10a, a part of a right side wall 10d, and a lower wall 10f (see FIGS. 1 and 2) which will be described later, and a part of the housing 10 of which illustration is omitted in FIG. 4 is the front wall 10a, a part of a left side wall 10c, a part of the right side wall 10d, and the lower wall 10f (see FIGS. 1 and 2) which will be described later.

As shown in FIGS. 1 to 4, the servo driver 1 is an electric device having a substantially rectangular parallelepiped outer shape and is constituted by a housing 10 and various internal components housed inside the housing 10. The servo driver 1 controls an operation of a servo motor (not shown) in accordance with a command from a host controller (not shown) and more specifically, controls an output torque, a rotation speed, a position, or the like of the servo motor.

The servo driver 1 includes an inverter equipped with a converter circuit, a smoothing circuit, an inverter circuit, a control circuit, a regenerative resistor, and the like. The various internal components housed inside the housing 10 described above include the converter circuit, the smoothing circuit, the inverter circuit, the control circuit, the regenerative resistors, and the like constituting the inverter. The smoothing circuit is constituted by two capacitors 27 which will be described later.

As shown in FIGS. 1 and 2, the housing 10 has a front wall 10a and a rear wall 10b located in front and rear sides, a left side wall 10c and a right side wall 10d located in left and right sides, and an upper wall 10e and a lower wall 10f located in upper and lower sides. The servo driver 1 is intended to be installed on a wall surface of a control panel or the like in a wall-mounted state, and therefore, the rear wall 10b of the housing 10 is provided with a fixing hole or the like for fixing the servo driver 1 to the wall surface.

Here, in the following description, directions in which the front wall 10a and the rear wall 10b are located when viewed from a central portion of the servo driver 1 are referred to as an X1 direction and an X2 direction, and a front-back direction which is a direction corresponding to the X1 direction and the X2 direction is also referred to as an X-axis direction. Further, directions in which the left side wall 10c and the right side wall 10d are located when viewed from a central portion of the servo driver 1 are referred to as a Y1 direction and a Y2 direction, and a left-right direction which is a direction corresponding to the Y1 direction and the Y2 direction is also referred to as a Y-axis direction. Further, directions in which the upper wall 10e and the lower wall 10f are located when viewed from a central portion of the servo driver 1 are referred to as a Z1 direction and a Z2 direction, and a vertical direction which is a direction corresponding to the Z1 direction and the Z2 direction is also referred to as a Z-axis direction.

The housing 10 is constituted by a lid body including the front wall 10a described above and a box body including the rear wall 10b, the left side wall 10c, the right side wall 10d, the upper wall 10e, and the lower wall 10f described above. The housing 10 has a substantially rectangular parallelepiped outer shape by the lid body being attached to the box body to close an opening provided in the box body described above.

The front wall 10a, the upper wall 10e, and the lower wall 10f are provided with various connection terminals for connecting to the host controller, the servo motor, or the like described above. Further, the left side wall 10c, the right side wall 10d, the upper wall 10e, and the lower wall 10f of the housing 10 are provided with a large number of ventilation holes, and a space inside the housing 10 and a space outside the housing 10 communicate with each other through the ventilation holes.

The housing 10 is formed by combining a plurality of members. Among these, the front wall 10a which is the lid body described above is formed from a substantially flat plate-shaped front side housing 11, and a part of the left side wall 10c which is a part of the box body described above is formed from a substantially flat plate-shaped left side housing 12, and a part of the right side wall 10d and a part of the upper wall 10e each of which is a part of the box body described above are formed from a bent plate-shaped right side housing 13 (see FIGS. 1 to 4, FIGS. 9 and 11, and the like).

As shown in FIG. 1, a part of the front wall 10a of the housing 10 constitutes a closing portion 14 that covers an opening portion 21a (see FIGS. 3 and 4) of a case body 21 which will be described later, and a capacitor module 20 (see FIGS. 3 and 4) including the case body 21 is located behind the closing portion 14.

Further, a display window part 15 for indicating an electricity storage state of the two capacitors 27 described above is provided at a predetermined position on the front wall 10a of the housing 10. A light emitting body 29b (see FIGS. 3 and 4) made of, for example, a light emitting diode (LED) or the like is provided behind the display window part 15. As a result, it is configured so that when the light emitting body 29b is lit, light emitted from the light emitting body 29b is emitted to the outside through the display window part 15, and a user can visually recognize whether the light emitting body 29b is lit or not. The details of the light emitting body 29b and an electricity storage state detection unit 29 (see FIGS. 3 and 4) provided with the light emitting body 29b will be described later.

As shown in FIGS. 3 and 4, a space in which the various internal components described above are housed is provided inside the housing 10. The capacitor module 20 including the two capacitors 27 and the case body 21 is disposed in the space, and the capacitor module 20 is located behind the closing portion 14 provided in the front wall 10a of the housing 10 as described above. More specifically, the capacitor module 20 is disposed in a front upper portion of the space inside the housing 10 to be adjacent to the front wall 10a, the left side wall 10c, the right side wall 10d, and the upper wall 10e of the housing 10.

As shown in FIGS. 1 to 4, the capacitor module 20 is assembled to the housing 10 by a first protrusion 23 and a second protrusion 25, which will be described later, provided at predetermined positions of the case body 21 being fitted to a first hole 16 and a second hole 18 (see FIGS. 9 to 12), which will be described later, provided in the left side wall 10c and the right side wall 10d of the housing 10, respectively. As a result, the two capacitors 27 and the case body 21 constituting the capacitor module 20 are housed in the space inside the housing 10. The detailed configuration of this point will be described later.

Further, as shown in FIGS. 3 and 4, the main board 30 is disposed in the space inside the housing 10 and behind a portion where the capacitor module 20 is disposed such that the main board 30 extends along a YZ plane. The main board 30 is a relay board for connecting the above-mentioned various circuits and the like constituting the inverter to each other.

Here, the above-mentioned two capacitors 27 constituting the smoothing circuit of the inverter are connected to the main board 30 via a bus bar and are each electrically connected to the inverter circuit and the converter circuit constituting the inverter through the main board 30 for relaying. The inverter circuit is constituted by a power module including package parts such as an intelligent power module (IPM), and the converter circuit is constituted by a diode module including the package parts.

In the present embodiment, the above-mentioned bus bar is divided into capacitor-side bus bars 28A and 28B incorporated in the capacitor module 20 and main board-side bus bars 31A and 31B assembled on the main board 30 side. When the capacitor-side bus bars 28A and 28B and the main board-side bus bars 31A and 31B are connected to each other, respectively, a smoothing circuit constituted by the two capacitors 27 is electrically connected to each of the inverter circuit and the converter circuit.

The above-mentioned inverter circuit and converter circuit correspond to circuit element components to be electrically connected to the two capacitors 27, and the above-mentioned main board-side bus bars 31A and 31B correspond to circuit element component-side bus bars.

<B. Configuration of Capacitor Module and Configuration in the Vicinity Thereof>

Figure 5:
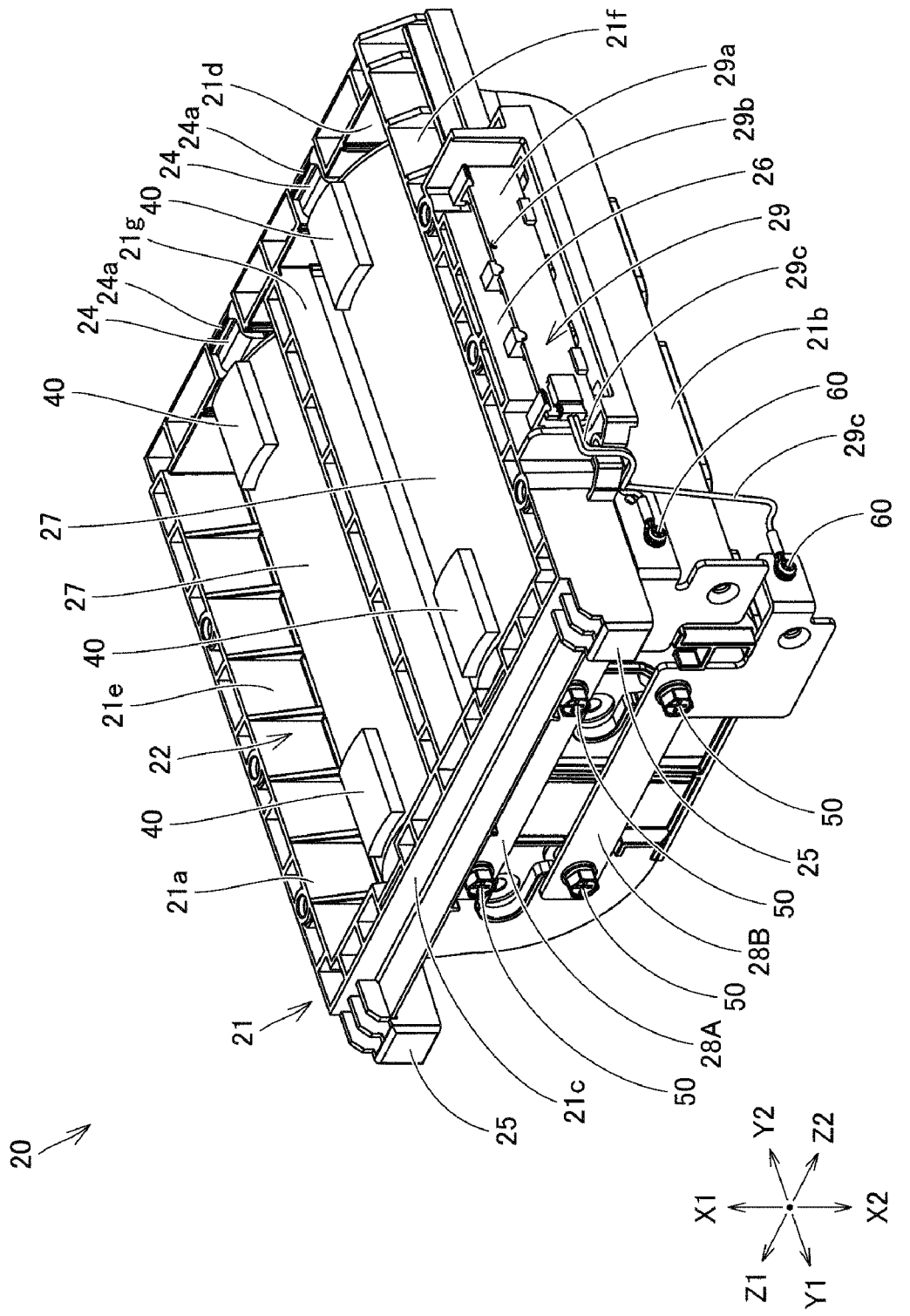
FIG. 5 is a perspective view of a capacitor module shown in FIGS. 3 and 4.
Figure 6:
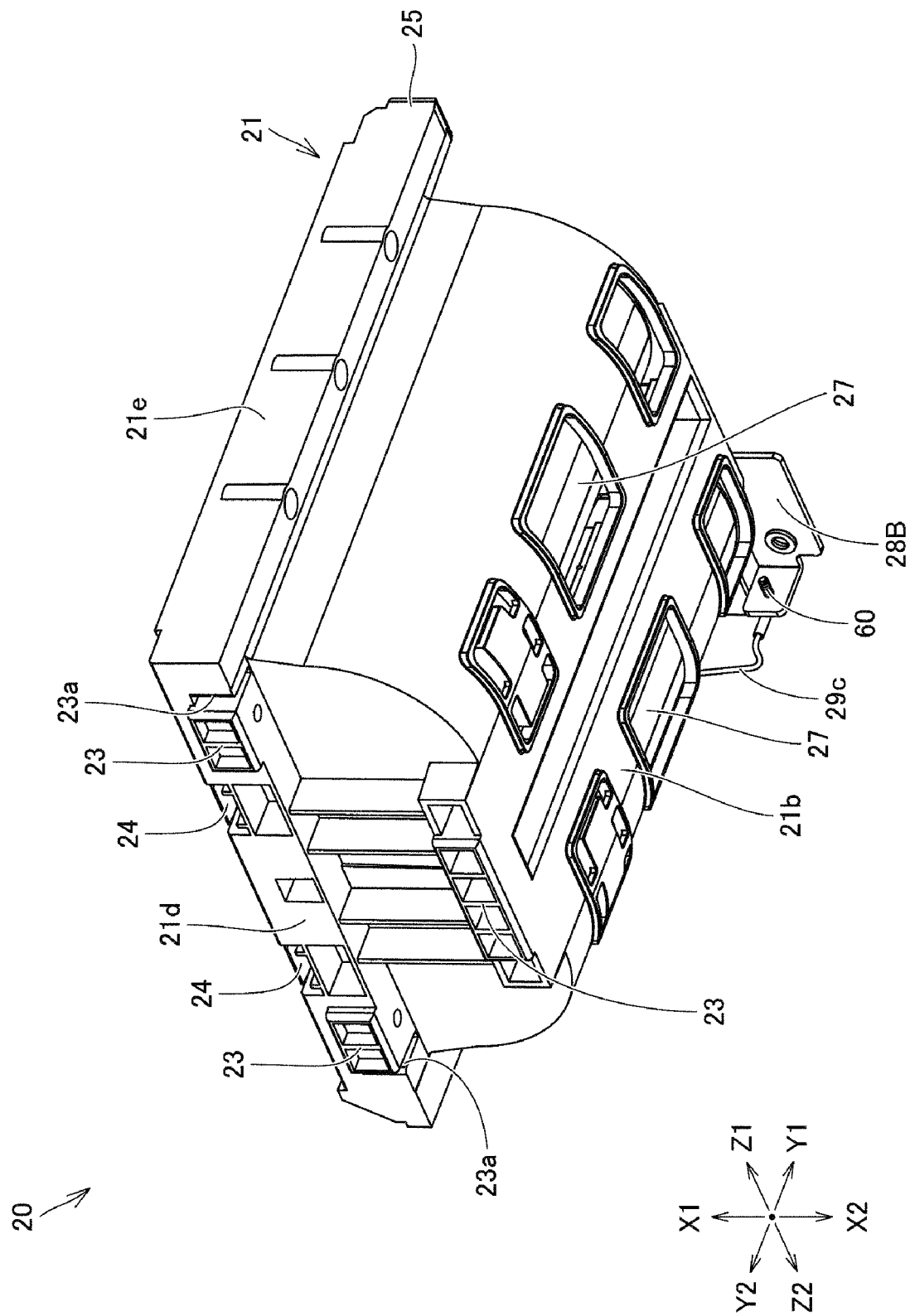
FIG. 6 is a perspective view of the capacitor module shown in FIG. 5 as viewed in another direction.
Figure 7:
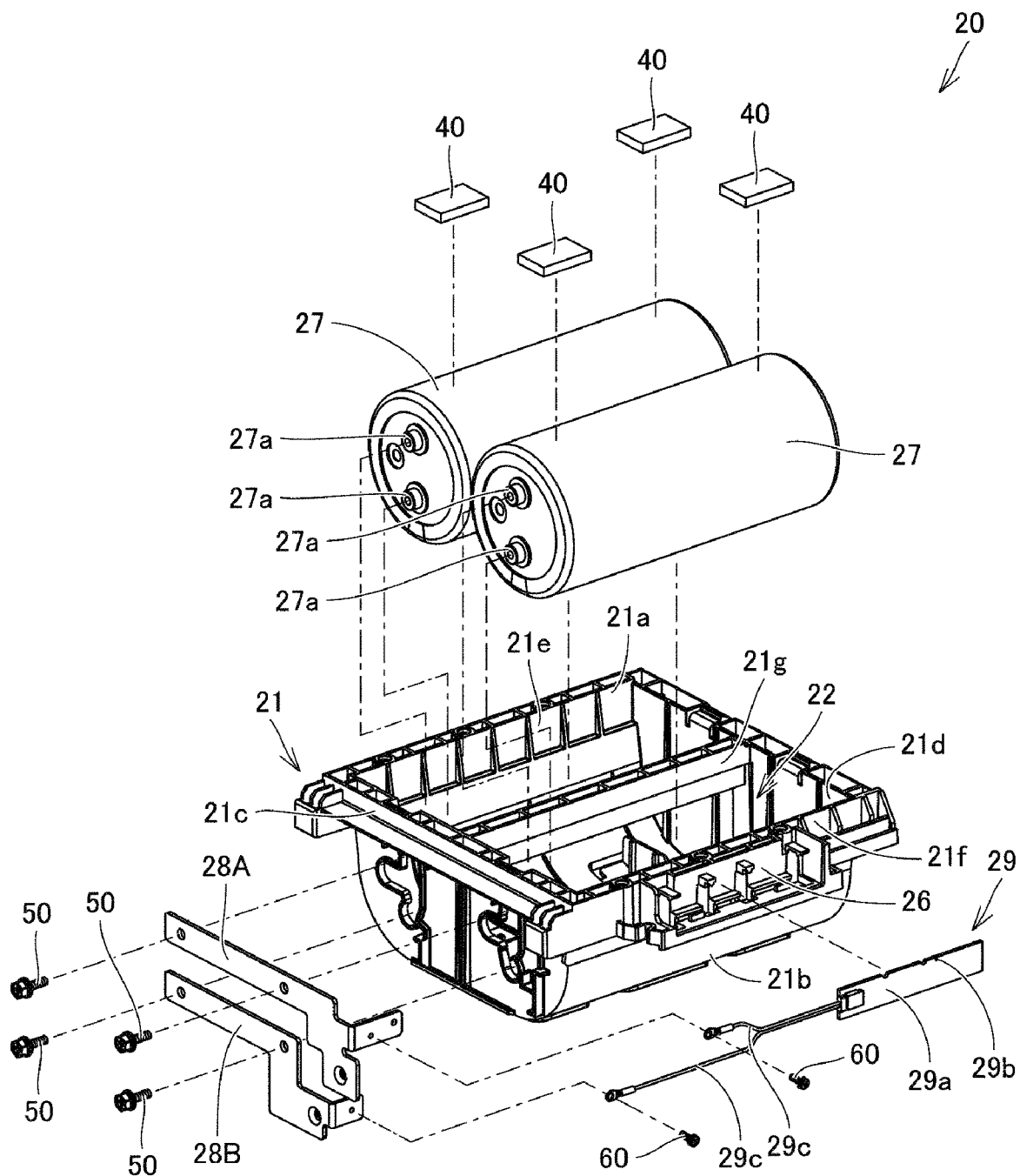
FIG. 7 is an exploded perspective view showing an assembly structure of the capacitor module shown in FIG. 5.
Figure 8:
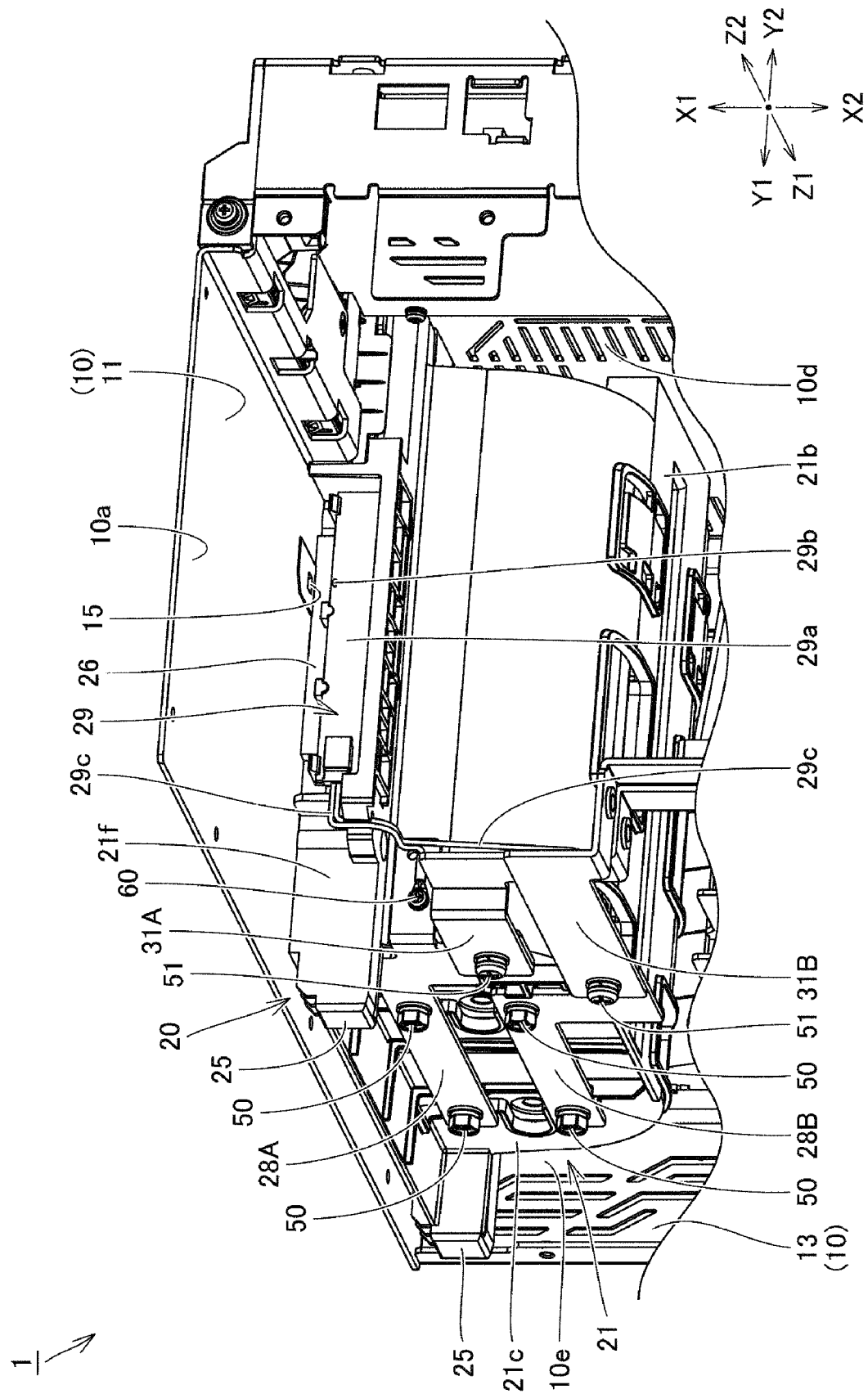
FIG. 8 is a partially broken perspective view showing a configuration in the vicinity of an electricity storage state detection unit in the servo driver shown in FIG. 1.

FIGS. 5 and 6 are perspective views of the above-mentioned capacitor module as viewed from the diagonally lower left of the front and the diagonally upper right of the rear. Further, FIG. 7 is an exploded perspective view showing an assembly structure of the capacitor module, and FIG. 8 is a partially broken perspective view showing a configuration in the vicinity of the electricity storage state detection unit in the servo driver 1 according to the present embodiment. Next, with reference to FIGS. 3 and 4 described above and FIGS. 5 to 8, a configuration of the capacitor module 20 in the servo driver 1 according to the present embodiment and a configuration in the vicinity thereof will be described in detail.

As shown in FIGS. 3 to 7, the capacitor module 20 mainly includes the case body 21, the two capacitors 27 each having a substantially cylindrical outer shape, and the capacitor-side bus bars 28A and 28B. The capacitor module 20 is configured such that the case body 21 is set as a base, the two capacitors 27 are stored in the case body 21, and a pair of capacitor-side bus bars 28A and 28B are attached to the two capacitors 27 housed in the case body 21. Further, in the present embodiment, the electricity storage state detection unit 29 is assembled at a predetermined position of the capacitor module 20.

The case body 21 has a box-like shape with an opening portion 21a provided in one surface and is made of an insulating resin member. More specifically, the case body 21 has a bottom portion 21b, and a left frame portion 21c, a right frame portion 21d, an upper frame portion 21e, and a lower frame portion 21f which extend from a peripheral edge of the bottom portion 21b. By the bottom portion 21b, the left frame portion 21c, the right frame portion 21d, the upper frame portion 21e, and the lower frame portion 21f being provided in the case body 21, a storage portion 22 (see particularly FIGS. 5 and 7) is provided inside the case body 21. Here, the above-mentioned opening portion 21a is defined by end portions of the left frame portion 21c, the right frame portion 21d, the upper frame portion 21e, and the lower frame portion 21f of a portion located on a side opposite to the bottom portion 21b.

As shown in FIGS. 3 and 4, the opening portion 21a of the case body 21 is located to face the front wall 10a to be covered with the closing portion 14 provided in the front wall 10a of the housing 10 as described above (see FIGS. 1, 11, and the like), and the upper frame portion 21e of the case body 21 is located to face the upper wall 10e of the housing 10. On the other hand, the left frame portion 21c of the case body 21 is located to face the left side wall 10c of the housing 10, and the right frame portion 21d of the case body 21 is located to face the right side wall 10d of the housing 10.

As shown in FIGS. 3 to 7, the case body 21 is provided with a partition portion 21g to bridge the left frame portion 21c and the right frame portion 21d. By the partition portion 21g being provided in the case body 21, the storage portion 22 provided inside the case body 21 is divided into two spaces, that is, a space located on a side of the upper frame portion 21e and a space located on a side of the lower frame portion 21f. The above-mentioned two capacitors 27 are stored in the spaces partitioned by the partition portion 21g in association with each other.

Here, each of the two capacitors 27 is stored in the storage portion 22 via the opening portion 21a provided in the case body 21 described above. More specifically, the opening portion 21a is provided to extend along the YZ plane so that the capacitor 27 can be taken in and out with respect to the storage portion 22 of the case body 21 in a direction (that is, the X-axis direction) orthogonal to an axial direction (that is, the Y-axis direction) of the capacitor 27.

With this configuration, the capacitor 27 can be easily fitted to the case body 21. Therefore, assembly work is greatly facilitated as compared with a case where the capacitor 27 is configured to be inserted into the case body 21 in the axial direction of the capacitor 27.

As shown in FIGS. 5 and 6, the right frame portion 21d of the case body 21 is provided with a plurality of first protrusions 23 and a plurality of locking protrusions 24, and the left frame portion 21c of the case body 21 is provided with a plurality of second protrusions 25. The plurality of first protrusions 23, the plurality of locking protrusions 24, and the plurality of second protrusions 25 are portions for assembling the case body 21 to the housing 10.

The plurality of first protrusions 23 is located to protrude outward (that is, in the Y2 direction) from an outer surface of the right frame portion 21d (that is, a surface facing the right side wall 10d of the housing 10) and each has a rectangular shape in a plan view. A direction in which the plurality of first protrusions 23 protrudes corresponds to a direction orthogonal to a direction in which the opening portion 21a and the bottom portion 21b of the case body 21 are aligned with each other.

In the present embodiment, a total of three first protrusions 23 including two first protrusions 23 provided at positions on a front end side (that is, a side in the X1 direction) of the right frame portion 21*d* and one first protrusion 23 provided at a position on a rear end side (that is, a side in the X2 direction) of the right frame portion 21*d* are provided in the case body 21. Among these, recesses 23*a* are provided adjacent to the two first protrusions 23 in the vicinity of each of the two first protrusions 23 provided on the front end side of the right frame portion 21*d*. Each of the recesses 23*a* has a shape recessed inward (that is, in the Y1 direction) from the outer surface of the right frame portion 21*d*.

The plurality of locking protrusions 24 is located to protrude outward (that is, in the X1 direction) from a front end surface of the right frame portion 21*d* (that is, a surface facing the front wall 10*a* of the housing 10) and each has a hook-shaped locking claw 24*a* at a tip end portion thereof. In the present embodiment, two locking protrusions 24 are provided in the case body 21.

On the other hand, the plurality of second protrusions 25 is located to protrude outward (that is, in the Y1 direction) from an outer surface of the left frame portion 21*c* (that is, a surface facing the left side wall 10*c* of the housing 10) and each has a rectangular shape in a plan view. A direction in which the plurality of second protrusions 25 protrudes corresponds to the direction orthogonal to the direction in which the opening portion 21*a* and the bottom portion 21*b* of the case body 21 are aligned with each other. In the present embodiment, two second protrusions 25 are provided at positions on a front end side (that is, a side in the X1 direction) of the left frame portion 21*c*.

As shown in FIGS. 5, 7 and 8, two through holes each having a substantially T-shape in a plan view are provided at predetermined positions of the left frame portion 21*c* of the case body 21. A pair of connection terminals 27*a* provided in each of the two capacitors 27 stored in the storage portion 22 are inserted into each of the two through holes.

The capacitor-side bus bars 28A and 28B are attached to the pair of connection terminals 27*a* in association with each other on an outer side of the case body 21, and thus electrical leading-out from the two capacitors 27 to the outside of the case body 21 is performed through the capacitor-side bus bars 28A and 28B. Bolts 50 are used to fix the pair of connection terminals 27*a* of each of the two capacitors 27 and the capacitor-side bus bars 28A and 28B to each other.

As described above, one end of each of the capacitor-side bus bars 28A and 28B is connected to each of the pair of connection terminals 27*a* of each of the two capacitors 27, and the other end of each of the capacitor-side bus bars 28A and 28B is led out from a position on the left frame portion 21*c* of the case body 21 toward an outer side on a side of the lower frame portion 21*f* of the case body 21. As shown in FIGS. 4 and 8, the other ends of the capacitor-side bus bars 28A and 28B which are the led out portions are connected to the main board-side bus bars 31A and 31B using bolts 51.

As shown in FIGS. 3 to 5, 7 and 8, a holding portion 26 for holding the electricity storage state detection unit 29 is provided at a predetermined position on an outer surface of the lower frame portion 21*f* of the case body 21. The holding portion 26 has a hook-shaped locking portion and holds the electricity storage state detection unit 29 by locking the electricity storage state detection unit 29 using the locking portion.

The electricity storage state detection unit 29 includes a sub-board 29*a*, a light emitting body 29*b* mounted on the sub-board 29*a*, and a pair of lead wires 29*c* led out from the sub-board 29*a*. Among these, the sub-board 29*a* is provided with a detection circuit that detects the electricity storage state of the two capacitors 27 by measuring a potential difference between each pair of connection terminals 27*a* of the two capacitors 27.

One end of each of the pair of lead wires 29*c* is connected to the above-mentioned detection circuit, and the other end thereof is connected to each of the above-mentioned capacitor-side bus bars 28A and 28B with screws 60. On the other hand, the light emitting body 29*b* displays a detection result of the above-mentioned detection circuit by being lit or not. The light emitting body 29*b* is lit in a case where the two capacitors 27 are in an electricity storage completed state and is not lit in a case where the two capacitors 27 are in a sufficiently discharged state.

Here, referring to FIG. 8, as described above, the servo driver 1 according to the present embodiment is configured so that the display window part 15 is provided at a predetermined position on the front wall 10*a* of the housing 10, and the above-mentioned light emitting body 29*b* is disposed behind the display window part 15. That is, the holding portion 26 provided in the lower frame portion 21*f* of the case body 21 described above for holding the electricity storage state detection unit 29 is disposed to be located behind the display window part 15.

Therefore, with such a configuration, the electricity storage state detection unit 29 can be incorporated in the capacitor module 20, and further, with a simple configuration in which the display window part 15 is provided in a part of the housing 10, it is possible to visually recognize from the outside whether the light emitting body 29*b* provided in the electricity storage state detection unit 29 is lit or not. Therefore, it becomes possible to greatly simplify the configuration for notifying the user of the electricity storage state, and in this respect, the assembly work of the servo driver 1 is greatly facilitated.

As shown in FIGS. 3 to 5 and 7, a cushion material 40 is attached to a peripheral surface of each of the two capacitors 27 having a substantially cylindrical outer shape. More specifically, the cushion material 40 is attached to a portion of the peripheral surface of the capacitor 27 facing the opening portion 21*a* (that is, a portion located on a side of the closing portion 14 provided in the front wall 10*a* of the housing 10). The cushion material 40 is made of an elastically deformable member having an adhesive or a pressure sensitive adhesive applied to one surface (that is, a main surface on a side of the capacitor 27).

Here, by appropriately setting a thickness of the cushion material 40, a main surface of the cushion material 40 located on a side opposite to the main surface of a side of the capacitor 27 is covered with the closing portion 14 provided in the front wall 10*a* of the housing 10 and comes into pressure contact with the closing portion 14. That is, the cushion material 40 is in a compressed state by being sandwiched between the closing portion 14 and the capacitor 27.

As a result, the elastically deformable cushion material 40 is interposed between the closing portion 14 and the capacitor 27. Then, the capacitor 27 becomes a state elastically biased to the bottom portion 21*b* of the case body 21, and in this state, the capacitor 27 is thereby sandwiched and held between the closing portion 14 and the bottom portion 21*b*. Therefore, by employing this configuration, it is possible to reliably hold the pair of capacitors 27 stored in the case body 21.

A cushion sheet having high thermal conductivity is preferably used as the cushion material 40. Consequently, heat generated in the capacitor 27 can be efficiently transferred to the housing 10, and a temperature rise of the capacitor 27 can be suppressed.

<C. Assembly Structure and Assembly Procedure of Capacitor Module to Housing>

Figure 9:
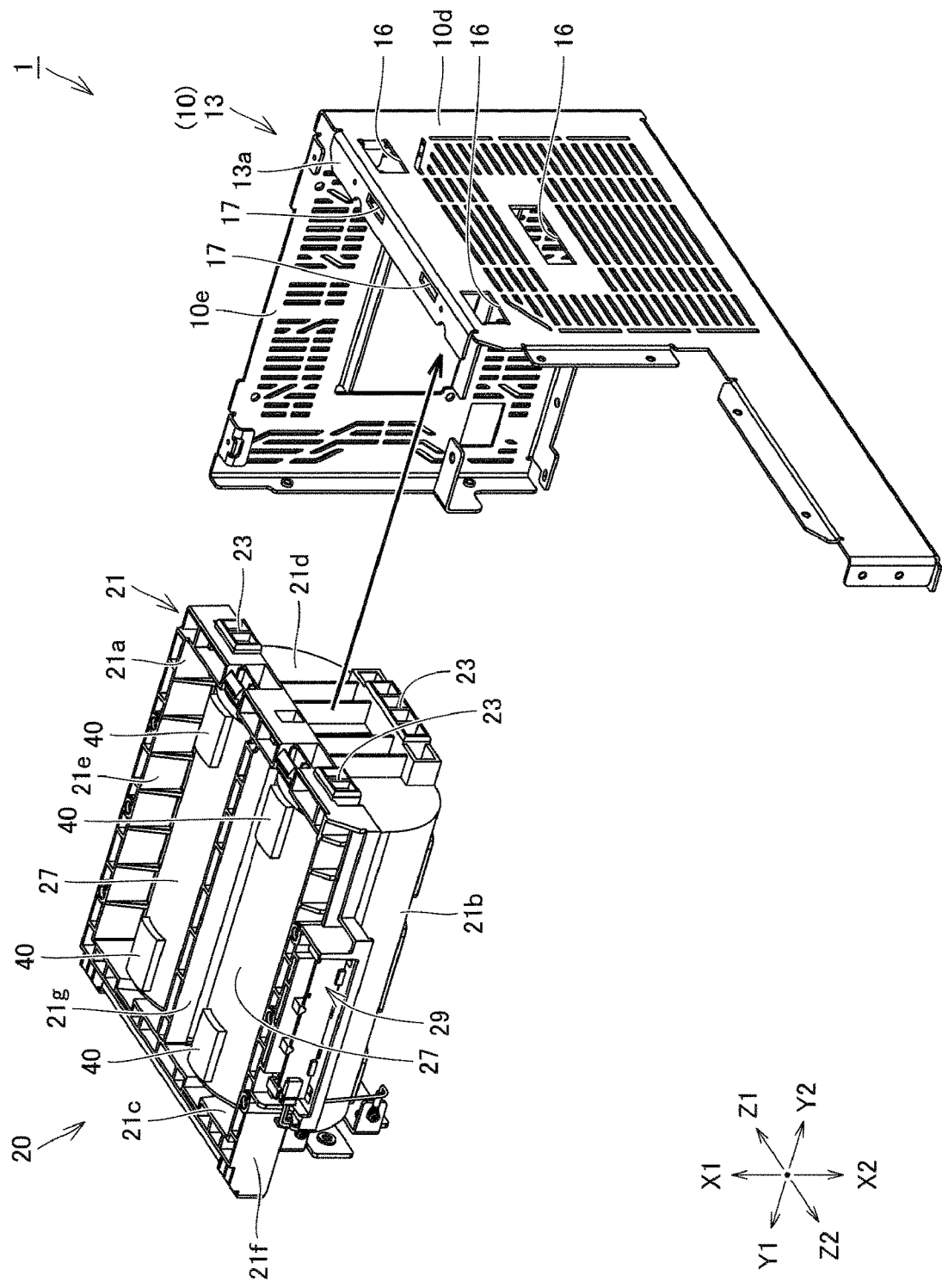
FIG. 9 is a perspective view showing a procedure for assembling the capacitor module to the housing in the servo driver shown in FIG. 1.
Figure 10:
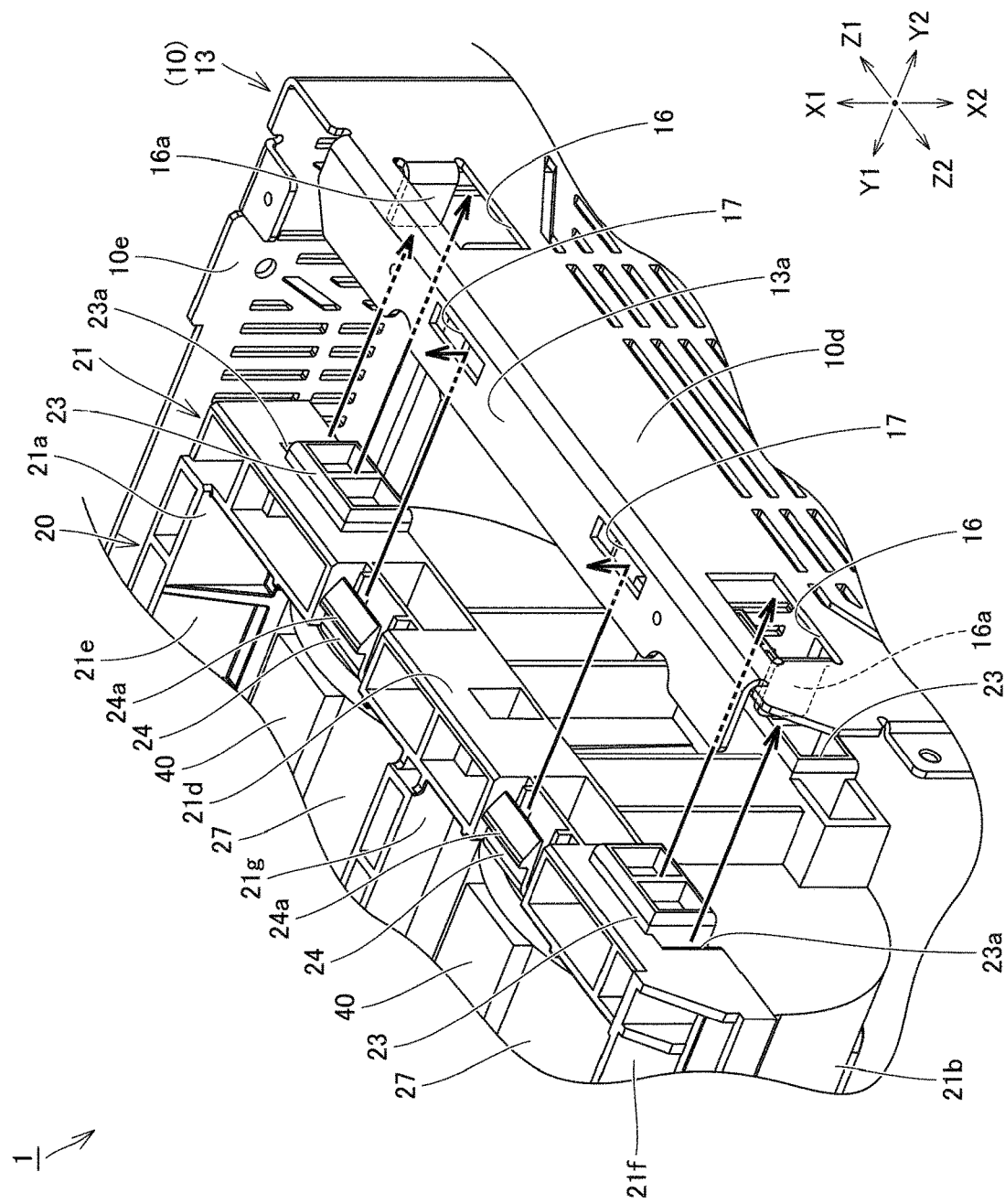
FIG. 10 is a partially broken perspective view showing an enlarged main part of the servo driver during assembly work shown in FIG. 9.
Figure 11:
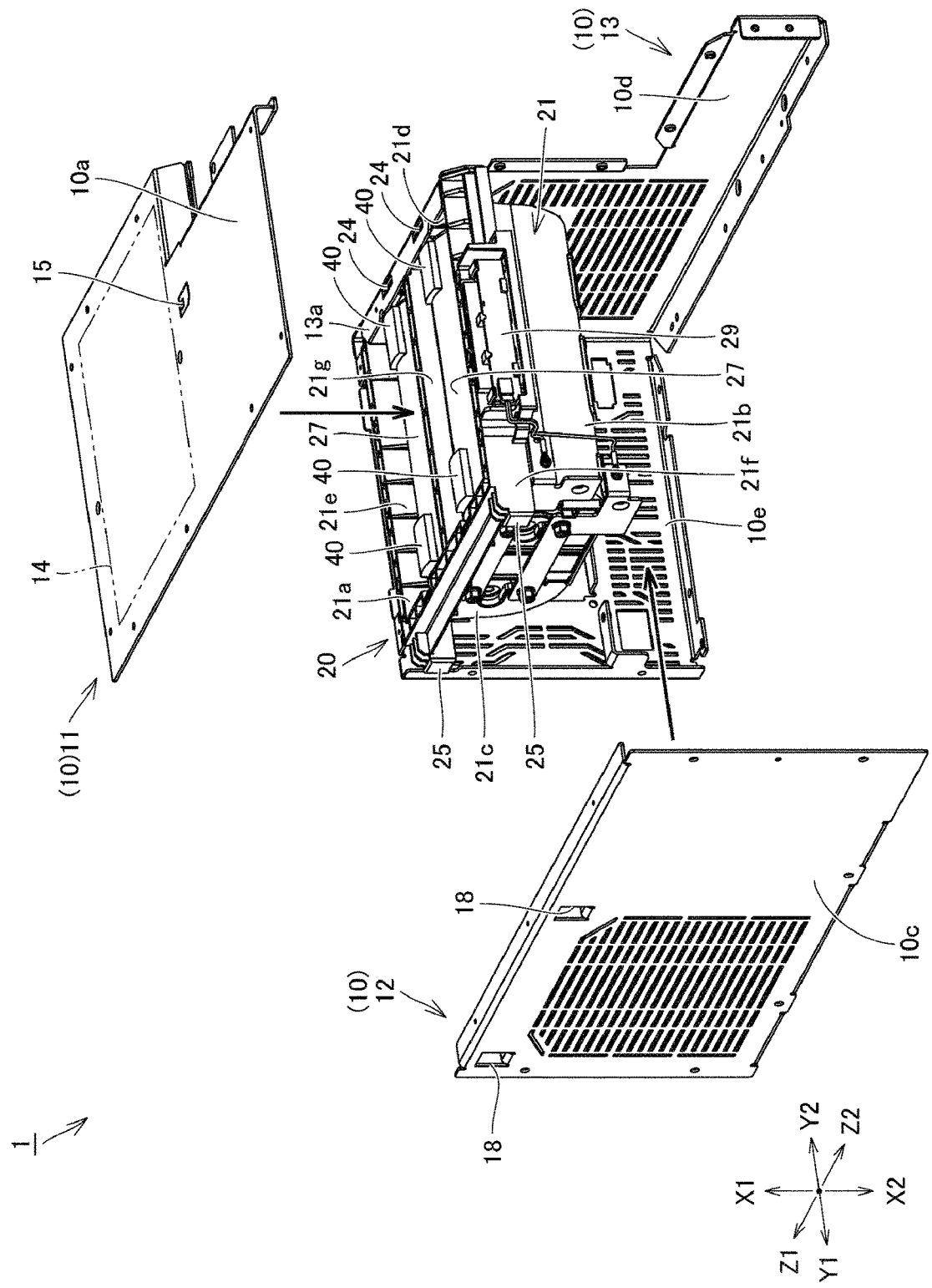
FIG. 11 is a perspective view showing a procedure for assembling the capacitor module to the housing in the servo driver shown in FIG. 1.
Figure 12:
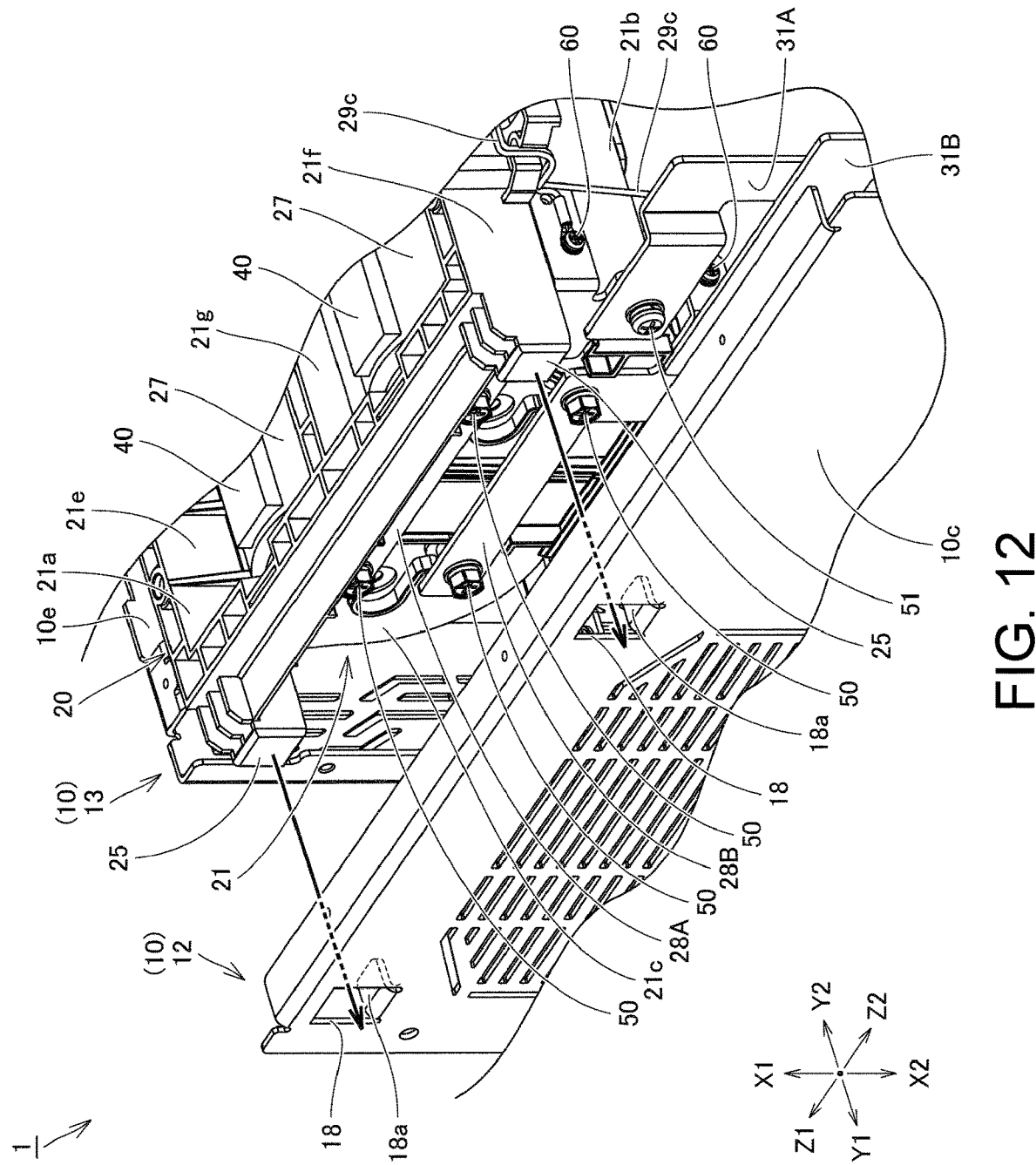
FIG. 12 is a partially broken perspective view showing an enlarged main part of the servo driver during assembly work shown in FIG. 11.

FIGS. 9 and 11 are perspective views showing a procedure for assembling the capacitor module to the housing in the servo driver according to the present embodiment. Further, FIGS. 10 and 12 are partially broken perspective views showing an enlarged main part of the servo driver during assembly work shown in FIGS. 9 and 11. Next, with reference to FIGS. 9 to 12, an assembly structure and an assembly procedure of the capacitor module 20 to the housing 10 in the servo driver 1 according to the present embodiment will be described in detail.

In addition, in FIGS. 9 to 12, only a portion of the servo driver 1 related to the assembly of the capacitor module 20 to the housing 10 is shown, and illustration of the other portions is omitted for easy understanding.

First, prior to explaining the assembly structure and the assembling procedure of the capacitor module 20 to the housing 10, a configuration of a portion of the housing 10 to which the capacitor module 20 is assembled (that is, the left side wall 10c and the right side wall 10d each of which is a part of the box body described above) will be described.

As shown in FIGS. 9 to 12, the right side wall 10d of the housing 10 is provided with a plurality of first holes 16 and a plurality of locking holes 17, and the left side wall 10c of the housing 10 is provided with a plurality of second holes 18. Among these, the plurality of locking holes 17 is provided in a bent portion 13a formed by bending a part of a front end side portion of the right side wall 10d. The plurality of first holes 16, the plurality of locking holes 17, and the plurality of second holes 18 are portions for assembling the case body 21 to the housing 10.

The plurality of first holes 16 is formed to penetrate the right side wall 10d in the Y-axis direction and each has a rectangular shape in a plan view. In the present embodiment, a total of three first holes 16 including two first holes 16 provided at positions on a front end side (that is, a side in the X1 direction) of the right side wall 10d and one first hole 16 provided at a position on a rear end side (that is, a side in the X2 direction) of the right side wall 10d with respect to the two first holes 16 are provided in the housing 10. The plurality of first holes 16 is provided corresponding to the plurality of first protrusions 23 provided in the case body 21 described above.

Among these, a first support protrusion 16a (see FIG. 10) having a cut and raised shape is provided in the vicinity of each of the two first holes 16 provided on the front end side of the right side wall 10d. The first support protrusion 16a has a shape protruding inward (that is, in the Y1 direction) of the housing 10 from the right side wall 10d. The first support protrusion 16a is provided corresponding to the recess 23a provided in the case body 21 described above.

The plurality of locking holes 17 is formed to penetrate the above-mentioned bent portion 13a of the right side wall 10d in the X-axis direction and each has an elongated rectangular shape in a plan view. In the present embodiment, two locking holes 17 are provided in the housing 10. The plurality of locking holes 17 is provided corresponding to the plurality of locking protrusions 24 provided in the case body 21 described above.

On the other hand, the plurality of second holes 18 is formed to penetrate the left side wall 10c in the Y-axis direction and each has a rectangular shape in a plan view. In the present embodiment, two second holes 18 are provided at positions on a front end side (that is, a side in the X1 direction) of the left frame portion 21c. The plurality of second holes 18 is provided corresponding to the plurality of second protrusions 25 provided in the case body 21 described above.

A second support protrusion 18a (see FIG. 12) having a cut and raised shape is provided in the vicinity of each of the two second holes 18. The second support protrusion 18a has a shape protruding inward (that is, in the Y2 direction) of the housing 10 from the left side wall 10c. The second support protrusion 18a is provided corresponding to the second protrusion 25 provided in the case body 21 described above.

As described above, the capacitor module 20 is assembled to the housing 10 by the first protrusion 23 and the second protrusion 25 provided at predetermined positions of the case body 21 being fitted to the first hole 16 and the second hole 18 provided in the left side wall 10c and the right side wall 10d of the housing 10, respectively.

Here, when the capacitor module 20 is assembled to the housing 10, as shown in FIGS. 9 to 12, the assembly is performed in a posture in which the front wall 10a of the housing 10 is located vertically above and the rear wall 10b of the housing 10 is located vertically below.

Specifically, first, as shown in FIG. 9, the capacitor module 20 in which the two capacitors 27 are stored in the case body 21 in advance and the capacitor-side bus bars 28A and 28B and the electricity storage state detection unit 29 are assembled to each other is assembled toward the right side wall 10d (that is, the right side housing 13) of the housing 10 from an arrow direction (that is, the Y2 direction) shown in the drawing.

At that time, as shown in FIG. 10, the plurality of first protrusions 23 provided in the right frame portion 21d of the case body 21 is fitted to the plurality of first holes 16 provided in the right side wall 10d of the housing 10 in association with each other, and the locking claws 24a of the plurality of locking protrusions 24 provided in the right frame portion 21d of the case body 21 are locked to the plurality of locking holes 17 provided in the bent portion 13a of the right side wall 10d of the housing 10 by being fitted to the plurality of locking holes 17 in association with each other. At this time, the plurality of first support protrusions 16a provided in the right side wall 10d of the housing 10 is inserted into the plurality of recesses 23a provided in the right frame portion 21d of the case body 21 in association with each other.

As a result, the plurality of first protrusions 23 and the plurality of first holes 16 are fitted to each other, and the plurality of first support protrusions 16a and the plurality of recesses 23a are fitted to each other, and thus, the capacitor module 20 is supported by the right side wall 10d. Further, the plurality of locking claws 24a is locked to the plurality of locking holes 17 to prevent the capacitor module 20 from falling off from the right side wall 10d.

Next, as shown in FIG. 11, the left side wall 10c (that is, the left side housing 12) of the housing 10 is assembled toward the right side housing 13 including the capacitor module 20 supported by the right side wall 10d of the housing 10 and the right side wall 10d from an arrow direction (that is, the Y2 direction) shown in the drawing.

At that time, as shown in FIG. 12, the plurality of second protrusions 25 provided in the left frame portion 21c of the case body 21 is fitted to the plurality of second holes 18 provided in the left side wall 10c of the housing 10 in association with each other. At this time, the plurality of second support protrusions 18a provided on the left side wall 10c of the housing 10 comes into contact with rear surfaces of the plurality of second protrusions 25 provided in the left frame portion 21c of the case body 21.

After that, the left side housing 12 including the left side wall 10c of the housing 10 is fixed to the right side housing 13 including the right side wall 10d of the housing 10 with screws (not shown), and thus the capacitor module 20 is sandwiched and held between the right side wall 10d and the left side wall 10c.

Next, as shown in FIG. 11, the front wall 10a (that is, the front side housing 11) of the housing 10 is assembled toward the right side housing 13 and the left side housing 12 of the housing 10 to cover the opening portion 21a of the case body 21 of the capacitor module 20 held by the right side wall 10d and the left side wall 10c of the housing 10 from an arrow direction (that is, the X2 direction) shown in the drawing.

Specifically, the front side housing 11 including the front wall 10a of the housing 10 is fixed to the right side housing 13 including the right side wall 10d of the housing 10 and the left side housing 12 including the left side wall 10c of the housing 10 with screws (not shown). As a result, the opening portion 21a of the case body 21 is covered with the closing portion 14 provided on the front wall 10a of the housing 10, and the closing portion 14 comes into contact with the cushion materials 40 previously attached to the two capacitors 27 stored in the case body 21.

Therefore, the cushion material 40 is sandwiched and compressed between the capacitor 27 and the closing portion 14. While being elastically biased to the bottom portion 21b of the case body 21, the capacitor 27 is thereby sandwiched and held between the closing portion 14 and the bottom portion 21b.

D. CONCLUSION

As described above, with the servo driver 1 according to the present embodiment, when the capacitor 27 is housed in the case body 21 and modularized as the capacitor module 20, not only the capacitor 27 can be easily fitted to the case body 21, but also the capacitor 27 stored in the case body 21 can be sandwiched and held between the bottom portion 21b of the case body 21 and the closing portion 14 which is a part of the housing 10. As a result, the assembly work is greatly facilitated. Further, by setting the cushion material 40 between the capacitor 27 and the closing portion 14, it is possible to reliably hold the capacitor 27 with the case body 21 and the housing 10.

Therefore, by employing the above configuration, it is possible to provide the servo driver 1 in which the capacitor 27 can be reliably held inside the housing 10 and the capacitor 27 can be easily assembled to the housing 10.

Further, since the servo driver 1 according to the present embodiment has a configuration in which the cushion material 40 is attached to the capacitor 27 in advance, it is possible to considerably easily interposed the cushion material 40 between the closing portion 14 and the capacitor 27, and in this respect as well, the assembly work can be facilitated.

Further, the servo driver 1 according to the present embodiment is configured so that the housing 10 is divided into the lid body (that is, the front side housing 11) which is a portion where the closing portion 14 is provided and the box body (that is, the housing other than the front side housing 11) provided with the opening closed by the lid body, and then the lid body is fixed to the box body after the capacitor module 20 is fixed to the box body by being fitted thereto, and thus the closing portion 14 covers the opening portion 21a of the case body 21. Therefore, it is possible to assemble the capacitor to the housing with considerably simple assembly work. Therefore, in this respect as well, the assembly work can be facilitated.

Further, the servo driver 1 according to the present embodiment is configured so that the bus bar which is connected to the capacitor 27 is divided, and thus the capacitor-side bus bars 28A and 28B thereof are incorporated in the capacitor module 20. Therefore, when the capacitor module 20 is assembled to the housing 10, the capacitor-side bus bars 28A and 28B are connected to the main board-side bus bars 31A and 31B which are the remaining bus bars previously assembled to the housing 10 in association with each other. This simple work makes it possible to electrically connect the capacitor 27 to other circuit element components. Therefore, with such a configuration, even in a case where the capacitor 27 is stored in the case body 21 and modularized, electrical connection can be reliably and easily performed.

Further, in the servo driver 1 according to the present embodiment, the case body 21 is made of an insulating resin member. Therefore, as compared with a case where the case body 21 is made of a metal member, not only it is possible to preemptively prevent a short circuit from occurring, but also it is possible to significantly reduce the weight of the servo driver 1 as a whole. Further, since the degree of freedom in designing the shape of the case body 21 is increased, the capacitor 27 can be held more reliably by the case body 21.

Further, in the servo driver 1 according to the present embodiment, since the cushion material 40 is made of a cushion sheet having high thermal conductivity, the heat generated in the capacitor 27 is efficiently dissipated through the cushion material 40 to the housing 10, and thus a good configuration can be obtained from the viewpoint of the heat dissipation efficiency of the capacitor 27.

E. Appendix

The characteristic configuration of the servo driver 1 according to the present embodiment described above is summarized as follows.

[Configuration 1]

A servo driver for controlling an operation of a servo motor, comprising:
  a capacitor (27) that constitutes a smoothing circuit of an inverter and has a substantially cylindrical outer shape;
  a case body (21) in which the capacitor is stored; and
  a housing (10) that houses the capacitor and the case body,
  wherein the case body has a substantially box-like shape formed by being provided with an opening portion (21a) that makes it possible to take in and out the capacitor with respect to the case body along a direction orthogonal to an axial direction of the capacitor,
  wherein the case body is assembled to the housing so that the opening portion is covered with a closing portion (14) that is a part of the housing, and
  wherein the capacitor is sandwiched and held between the closing portion and a bottom portion (21b) of the case body located on a side opposite to a side on which the opening portion is provided while being elastically biased to the bottom portion with a cushion material (40) that is elastically deformable and is interposed between the closing portion and the capacitor.

[Configuration 2]

The servo driver according to configuration 1, wherein the cushion material is attached to either the closing portion or the capacitor.

[Configuration 3]

The servo driver according to configuration 1 or 2,
wherein the housing includes a lid body (11) including a portion in which the closing portion is provided and a box body (12, 13) having an opening closed by the lid body,
wherein the case body has a plurality of protrusions (23, 25) protruding in a direction orthogonal to a direction in which the opening portion and the bottom portion are aligned with each other,
wherein a plurality of holes (16, 18) is provided in a portion of the box body facing the case body in the direction orthogonal to the direction in which the opening portion and the bottom portion are aligned with each other, and
wherein the case body is fixed to the box body by the plurality of protrusions being fitted to the plurality of holes.

[Configuration 4]

The servo driver according to any one of configurations 1 to 3, comprising:
an electricity storage state detection unit (29) provided with a detection circuit that detects an electricity storage state of the capacitor by measuring a potential difference between a pair of connection terminals (27a) of the capacitor and a light emitting body (29b) that displays a detection result obtained from the detection circuit by being lit or not,
wherein the electricity storage state detection unit is assembled to the case body, and a display window part (15) enabling visual recognition from the outside of whether the light emitting body is lit or not is provided in the housing.

[Configuration 5]

The servo driver according to any one of configurations 1 to 4,
wherein the capacitor and a circuit element component to be electrically connected to the capacitor are connected by a bus bar, and
wherein the bus bar is divided into a capacitor-side bus bar (28A, 28B)) having one end connected to the capacitor and a circuit element component-side bus bar (31A, 31B) having one end connected to the circuit element component and the other end connected to the other end of the capacitor-side bus bar.

[Configuration 6]

The servo driver according to any one of configurations 1 to 5, wherein the case body is made of an insulating resin member.

[Configuration 7]

The servo driver according to any one of configurations 1 to 6, wherein the cushion material is made of a cushion sheet having high thermal conductivity.

F. OTHER FORMS AND THE LIKE

In the above-described embodiment, the case where the cushion material is attached to the capacitor has been described as an example, but the cushion material may be attached to the closing portion of the housing, or the cushion material may be simply interposed between the capacitor and the closing portion in a state where the closing portion is not attached to any of the capacitor and the closing portion.

Further, the configuration of the housing, the configuration of the case body, the configuration of the bus bar, and the like shown in the above-described embodiment can be changed as appropriate and are not limited to the configurations shown in the above-described embodiment.

Further, in the above-described embodiment, the case where a plurality of protrusions is provided in the case body, and a plurality of holes to which these protrusions can be fitted is provided in the box body of the housing, and thus the capacitor module is fixed to the housing has been described as an example, but the capacitor module may be assembled to the housing by employing another assembly structure.

As described above, the above-described embodiment disclosed this time is an example in all respects and is not limiting. The technical scope of the present invention is defined by the scope of claims and includes all modifications within the meaning and scope of the description of the claims and the equivalent.

What is claimed is:

1. A servo driver for controlling an operation of a servo motor, comprising:
a capacitor that constitutes a smoothing circuit of an inverter and has a substantially cylindrical outer shape;
a case body in which the capacitor is stored; and
a housing that houses the capacitor and the case body,
wherein the case body has a substantially box-like shape formed by being provided with an opening portion that makes it possible to take in and out the capacitor with respect to the case body along a direction orthogonal to an axial direction of the capacitor,
wherein the case body is assembled to the housing so that the opening portion is covered with a closing portion that is a part of the housing, and
wherein the capacitor is sandwiched and held between the closing portion and a bottom portion of the case body located on a side opposite to a side on which the opening portion is provided while being elastically biased to the bottom portion with a cushion material that is elastically deformable and is interposed between the closing portion and the capacitor.

2. The servo driver according to claim 1, wherein the cushion material is attached to either the closing portion or the capacitor.

3. The servo driver according to claim 2,
wherein the housing comprises a lid body comprising a portion in which the closing portion is provided and a box body having an opening closed by the lid body,
wherein the case body has a plurality of protrusions protruding in a direction orthogonal to a direction in which the opening portion and the bottom portion are aligned with each other,
wherein a plurality of holes is provided in a portion of the box body facing the case body in the direction orthogonal to the direction in which the opening portion and the bottom portion are aligned with each other, and
wherein the case body is fixed to the box body by the plurality of protrusions being fitted to the plurality of holes.

4. The servo driver according to claim 1,
wherein the housing comprises a lid body comprising a portion in which the closing portion is provided and a box body having an opening closed by the lid body, wherein the case body has a plurality of protrusions protruding in a direction orthogonal to a direction in which the opening portion and the bottom portion are aligned with each other, wherein a plurality of holes is provided in a portion of the box body facing the case body in the direction orthogonal to the direction in which the opening portion and the bottom portion are aligned with each other, and wherein the case body is fixed to the box body by the plurality of protrusions being fitted to the plurality of holes.

5. The servo driver according to claim 1, comprising:

an electricity storage state detection unit provided with a detection circuit that detects an electricity storage state of the capacitor by measuring a potential difference between a pair of connection terminals of the capacitor and a light emitting body that displays a detection result obtained from the detection circuit by being lit or not, wherein the electricity storage state detection unit is assembled to the case body, and a display window part enabling visual recognition from the outside of whether the light emitting body is lit or not is provided in the housing.

6. The servo driver according to claim 1, wherein the capacitor and a circuit element component to be electrically connected to the capacitor are connected by a bus bar, and wherein the bus bar is divided into a capacitor-side bus bar having one end connected to the capacitor and a circuit element component-side bus bar having one end connected to the circuit element component and the other end connected to the other end of the capacitor-side bus bar.

7. The servo driver according to claim 1, wherein the case body is made of an insulating resin member.

8. The servo driver according to claim 1, wherein the cushion material is made of a cushion sheet having high thermal conductivity.

* * * * *